(12) United States Patent
Awaji et al.

(10) Patent No.: US 7,557,561 B2
(45) Date of Patent: Jul. 7, 2009

(54) ELECTRONIC DEVICE, CIRCUIT AND TEST APPARATUS

(75) Inventors: Toshiaki Awaji, Tokyo (JP); Takashi Sekino, Tokyo (JP); Takayuki Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 179 days.

(21) Appl. No.: 11/759,240

(22) Filed: Jun. 7, 2007

(65) Prior Publication Data

US 2007/0262800 A1 Nov. 15, 2007

Related U.S. Application Data

(63) Continuation of application No. PCT/JP2007/052565, filed on Feb. 14, 2007.

(51) Int. Cl.
*H03L 7/00* (2006.01)
(52) U.S. Cl. .............. 324/76.77; 324/76.54; 324/76.52; 327/161; 714/700
(58) Field of Classification Search ............. 324/76.77, 324/76.54; 327/161
See application file for complete search history.

(56) References Cited

U.S. PATENT DOCUMENTS 5,578,935 A * 11/1996 Burns .......................... 324/763
6,789,224 B2 * 9/2004 Miura ......................... 714/744
7,283,920 B2 * 10/2007 Doi et al. ..................... 702/125
7,461,316 B2 * 12/2008 Hasegawa et al. ........... 714/744
2002/0003433 A1 1/2002 Housako
2004/0250180 A1 12/2004 Hotta
2007/0006031 A1 1/2007 Kantake

FOREIGN PATENT DOCUMENTS

| JP | 2001201532 | 7/2001 |
|---|---|---|
| JP | 2001356153 | 12/2001 |
| JP | 2003121501 | 4/2003 |

\* cited by examiner

*Primary Examiner*—Vincent Q Nguyen
*Assistant Examiner*—John Zhu
(74) *Attorney, Agent, or Firm*—Jianq Chyun IP Office

(57) ABSTRACT

There is provided an electronic device for receiving an input data signal and an input clock signal that indicates a timing to obtain the input data signal. The electronic device includes a first adjusting section that adjusts a phase difference between the input data signal and the input clock signal so as to be equal to a first phase difference, and outputs the resulting signals as a first data signal and a first clock signal, a phase varying section that outputs a second clock signal having a designated phase difference with respect to the first clock signal, and a second adjusting section that adjusts the phase difference of the second clock signal with respect to the first clock signal so as to be equal to a second phase difference, based on a result of obtaining the first clock signal at a varying timing of the second clock signal.

18 Claims, 11 Drawing Sheets

US 7,557,561 B2

ELECTRONIC DEVICE, CIRCUIT AND TEST APPARATUS

CROSS REFERENCE TO RELATED APPLICATION

This is a continuation application of PCT/JP2007/052565 filed on Feb. 14, 2007 which claims priority from an International Application No. PCT/JP2006/309097 filed on May 1, 2006, the contents of which are incorporated herein by reference.

BACKGROUND

1. Technical Field

The present invention relates to a test apparatus, a circuit and an electronic device. More particularly, the present invention relates to a test apparatus, a circuit and an electronic device which are designed to adjust the phase of a clock signal. The present application relates to the following international patent application. The contents of the patent application identified below are incorporated by reference herein, if applicable.

PCT/JP2006/309097 filed on May 1, 2006

2. Related Art

In recent years, semiconductor memories which can be accessed at a high speed have been increasingly configured by employing source synchronous clocking. Such a semiconductor memory is designed to generate therein not only a data signal but also a clock signal synchronized to the data signal. An external device reads the data signal in synchronization with the clock signal, which enables high-speed and efficient access to the semiconductor memory.

No relative art documents have been realized so far, and are therefore listed herein.

When testing such a semiconductor memory, a conventional test apparatus adjusts a reference clock signal for testing so as to be in synchronization with the clock signal obtained from the semiconductor memory. The test apparatus subsequently performs a test to examine whether to be capable of reading the data signal in accordance with the adjusted reference clock signal. Also, the test apparatus intentionally generates a delay in the reference clock signal by using a strobe signal, to perform another test to examine whether to be capable of reading the data when the delay takes a value within a reference range.

Here, jitter may be generated in the data signal generated by the semiconductor memory. When jitter is generated in the data signal, it is highly likely that similar jitter is generated in the clock signal generated by the semiconductor memory. Here, however, once adjusted, the reference clock signal of the conventional test apparatus is not affected by the jitter generated in the clock signal. Consequently, the generated jitter may cause a phase difference to occur between the reference clock signal and data signal, which may lower the accuracy of the test.

SUMMARY

In view of the above, an object of the present invention is to provide a test apparatus, a circuit and an electronic device which can solve the above-described problem. This object is achieved by combining the features recited in the independent claims. The dependent claims define further effective specific example of the present invention.

A first embodiment of the present invention provides an electronic device for receiving an input data signal and an input clock signal that indicates a timing to obtain the input data signal. The electronic device includes a first adjusting section that adjusts a phase difference between the input data signal and the input clock signal so as to be equal to a first phase difference, and outputs the resulting signals as a first data signal and a first clock signal, a phase varying section that outputs a second clock signal having a designated phase difference with respect to the first clock signal, and a second adjusting section that adjusts the phase difference of the second clock signal with respect to the first clock signal so as to be equal to a second phase difference, based on a result of obtaining the first clock signal at a varying timing of the second clock signal.

The electronic device may further include a receiving circuit that receives the input data signal and the input clock signal, to receive data, and a data obtaining section that obtains the first data signal at the varying timing of the second clock signal, to receive data. Here, the receiving circuit may include the first adjusting section, and the phase varying section.

The electronic device may receive the input data signal and the input clock signal from an external device.

The electronic device may receive the input data signal from an external device, and further include a clock restoring circuit that restores the input clock signal from the input data signal, and the receiving circuit may receive the input data signal that is received from the external device and the input clock signal that is restored by the clock restoring circuit, to receive data.

The first adjusting section may adjust at least one of phases off the input data signal and the input clock signal, and output the resulting signals as the first data signal and the first clock signal which have varying timings coinciding with each other, the phase varying section may include a variable delay circuit that delays the input clock signal by a designated time, and outputs the delayed input clock signal as the second clock signal, the second adjusting section may adjust a delay amount of the variable delay circuit based on the result of obtaining the first clock signal at the varying timing of the second clock signal, so as to adjust the phase difference of the second clock signal with respect to the first clock signal to be equal to a desired phase difference, and the electronic device may receive a signal from the external device by obtaining the first data signal at the varying timing of the second clock signal.

A second embodiment of the present invention provides an electronic device for receiving a signal from an external device. The electronic device includes a reference clock generator that generates a reference clock a first variable delay circuit that delays a data signal output from the external device by a designated time, and outputs the delayed data signal, a second variable delay circuit that delays, by a designated time, a clock signal which is output from the external device and indicates a timing at which the data signal is obtained, and outputs the delayed clock signal as a first delayed clock signal, a first flip-flop that obtains the delayed data signal at a timing determined by the reference clock, a second flip-flop that obtains the first delayed clock signal at a timing determined by the reference clock a first delay adjusting section that adjusts at least one of delay amounts of the first and second variable delay circuits so that the first and second flip-flops respectively obtain the delayed data signal and first delayed clock signal at a varying timing of a signal, a third variable delay circuit that delays the clock signal by a designated time, and outputs the delayed clock signal as a second delayed clock signal, and a second delay adjusting section that adjusts a phase difference between the first and second delayed clock signals so as to be equal to a desired phase difference, by adjusting a delay amount of the third variable delay circuit based on a result of obtaining the first delayed clock signal whose phase is adjusted by the first delay adjusting section at a varying timing of the second delayed clock signal. Here, the electronic device receives the signal from the external device by obtaining the delayed data signal at the varying timing of the second delayed clock signal.

A third embodiment of the present invention provides a circuit for receiving an input data signal from a device and an input clock signal indicating a timing to obtain the input data signal. The circuit includes a first adjusting section that adjusts a phase difference between the input data signal and the input clock signal so as to be equal to a first phase difference, and outputs the resulting signals as a first data signal and a first clock signal, a phase varying section that outputs a second clock signal having a designated phase difference with respect to the first clock signal, and a second adjusting section that adjusts the phase difference of the second clock signal with respect to the first clock signal so as to be equal to a second phase difference, based on a result of obtaining the first clock signal at a varying timing of the second clock signal.

The circuit may further include a data obtaining section that obtains the first data signal at the varying timing of the second clock signal, to receive data. The first adjusting section may adjust at least one of phases of the input data signal and the input clock signal, and output the resulting signals as the first data signal and the first clock signal which have varying timings coinciding with each other, the phase varying section may include a variable delay circuit that delays the input clock signal by a designated time, and output the delayed input clock signal as the second clock signal, the second adjusting section may adjust a delay amount of the variable delay circuit based on the result of obtaining the first clock signal at the varying timing of the second clock signal, so as to adjust the phase difference of the second clock signal with respect to the first clock signal to be equal to a desired phase difference, and the circuit may receive a signal from the device by obtaining the first data signal at the varying timing of the second clock signal.

A fourth embodiment of the present invention provides a circuit for receiving a signal from a device. The circuit includes a reference clock generator that generates a reference clock, a first variable delay circuit that delays a data signal output from the device by a designated time, and outputs the delayed data signal, a second variable delay circuit that delays, by a designated time, a clock signal which is output from the device and indicates a timing at which the data signal is obtained, and outputs the delayed clock signal as a first delayed clock signal, a first flip-flop that obtains the delayed data signal at a timing determined by the reference clock, a second flip-flop that obtains the first delayed clock signal at a timing determined by the reference clock, a first delay adjusting section that adjusts at least one of delay amounts of the first and second variable delay circuits so that the first and second flip-flops respectively obtain the delayed data signal and first delayed clock signal at a varying timing of a signal, a third variable delay circuit that delays the clock signal by a designated time, and outputs the delayed clock signal as a second delayed clock signal, and a second delay adjusting section that adjusts a phase difference between the first and second delayed clock signals so as to be equal to a desired phase difference, by adjusting a delay amount of the third variable delay circuit based on a result of obtaining the first delayed clock signal whose phase is adjusted by the first delay adjusting section at a varying timing of the second delayed clock signal. Here, the circuit receives the signal from the device by obtaining the delayed data signal at the varying timing of the second delayed clock signal.

The circuit may further include a first selecting section that selects one of a signal generated based on the reference clock and the second delayed clock signal, and supplies the selected signal to the first and second flip-flops. Here, the first delay adjusting section may adjust the delay amounts of the first and second variable delay circuits, while the first selecting section is configured so as to supply the signal generated based on the reference clock to the second flip-flop, the second delay adjusting section may determine the delay amount of the third variable delay circuit, while the first selecting section is configured so as to supply the second delayed clock signal to the second flip-flop, and the first flip-flop may obtain the delayed data signal at the varying timing of the second delayed clock signal, while the first selecting section is configured so as to supply the second delayed clock signal to the first and second flip-flops.

The first delay adjusting section may cause the first and second flip-flops to obtain the data signal and the clock signal at a plurality of times, while varying the delay amounts of the first and second variable delay circuits, and detect (i) such a delay amount of the first variable delay circuit that the numbers of times at which logical values L and H of the data signal are obtained become substantially same and (ii) such a delay amount of the second variable delay circuit that the numbers of times at which logical values L and H of the clock signal are obtained become substantially same, and assign the detected delay amounts to the first and second variable delay circuits.

The second delay adjusting section may adjust the delay amount of the third variable delay circuit so that the varying timing of the second delayed clock signal is positioned so as to coincide with a substantially middle point within an H or L level period of the first delayed clock sig.

The third variable delay circuit may include therein (i) an adjusting variable delay circuit that adjusts a phase of the second delayed clock signal and (ii) a strobe variable delay circuit that varies a strobe position of the delayed data signal which is determined by the second delayed clock signal, the second delay adjusting section may adjust the phase difference between the first and second delayed clock signals so as to be equal to the desired phase difference, by adjusting a delay amount of the adjusting variable delay circuit while a delay amount of the strobe variable delay circuit is set to a predetermined delay amount, and the first flip-flop may obtain the delayed data signal at the varying timing of the second delayed clock signal, based on a result of obtaining the delayed data signal at the varying timing of the second delayed clock signal while the delay amount of the strobe variable delay circuit is varied.

A fifth embodiment of the present invention provides a test apparatus for testing a device under test. The test apparatus includes a first adjusting section that adjusts a phase difference between a data signal and a clock signal so as to be equal to a first phase difference, and outputs the resulting signals as a first data signal and a first clock signal, wherein the data signal is output from the device under test and the clock signal indicates a timing at which the data signal is obtained, a phase varying section that outputs a second clock signal having a designated phase difference with respect to the first clock signal, a second adjusting section that adjusts the phase difference of the second clock signal with respect to the first clock signal so as to be equal to a second phase difference, based on a result of obtaining the first clock signal at a varying timing of the second clock signal, and a judging section that judges whether a signal output from the device under test passes or fails a test, based on a result of obtaining the first data signal at the varying timing of the second clock signal.

The test apparatus may receive the data and clock signals from the device under test.

The test apparatus may receive the data signal from the device under test, and further include a clock restoring circuit that restores the clock signal from the received data signal, and the first adjusting section may adjust the phase difference between the data signal that is received from the device under test and the clock signal that is restored by the clock restoring circuit so as to be equal to the first phase difference, and output the resulting signals as the first data signal and first clock signal.

The first adjusting section may adjust at least one of phases of the data signal and the clock signal, and output the resulting signals as the first data signal and the first clock signal which have varying timings coinciding with each other, wherein the data signal is output from the device under test and the clock signal indicates a timing at which the data signal is obtained, the phase varying section may include a variable delay circuit that delays the clock signal by a designated time, and outputs the delayed clock signal as the second clock signal, the second adjusting section may adjust a delay amount of the variable delay circuit based on the result of obtaining the first clock signal at the varying timing of the second clock signal, so as to adjust the phase difference of the second clock signal with respect to the first clock signal to be equal to a desired phase difference.

Here, all the necessary features of the present invention are not listed in the summary. The sub-combinations of the features may become the invention.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
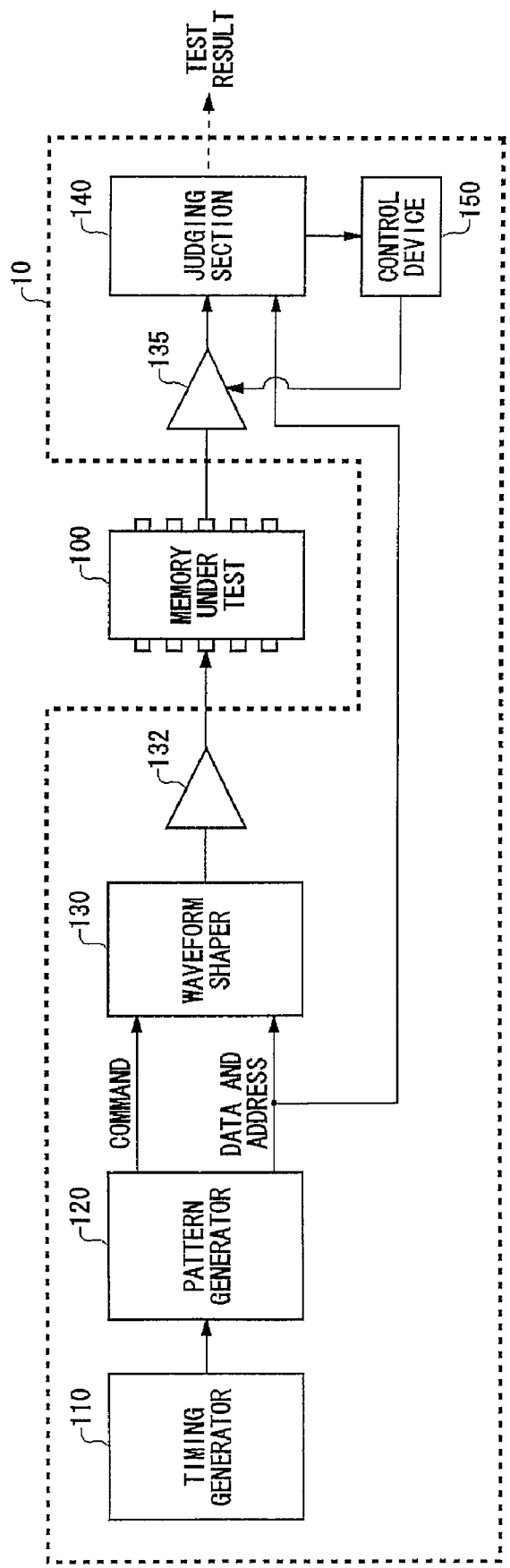
FIG. 1 illustrates the overall configuration of a test apparatus 10.

FIG. 1 illustrates the overall configuration of a test apparatus 10. The test apparatus 10 includes therein a timing generator 110, a pattern generator 120, a waveform shaper 130, a driver circuit 132, a comparator circuit 135, a judging section 140, and a control device 150. The test apparatus 10 is configured so as to test a device under test (DUT) 100 such as a semiconductor memory device. The tiring generator 110 generates a reference clock which is, for example, a periodic clock and supplies the generated periodic clock to the pattern generator 120. In accordance with the periodic clock the pattern generator 120 generates data indicating a test pattern to be input into the DUT 100, an address to be input into the DUT 100, and a control command to be input into the DUT 100. The pattern generator 120 outputs the generated data, address and command to the waveform shaper 130. The pattern generator 120 also outputs the data indicating the test pattern to the judging section 140 as expected value data.

The waveform shaper 130 shapes the waveforms of the input test pattern, address and control command into the signal waveforms which can be input into the DUT 100. The waveform shaper 130 supplies the resulting signals to the DUT 100 via the driver circuit 132. The comparator circuit 135 reads a data signal from the DUT 100. When the DUT 100 is configured by employing source synchronous clocking, the comparator circuit 135 may read the data signal in synchronization with a clock signal supplied thereto from the DUT 100. The judging section 140 compares the data indicated by the read data signal with the expected value data input thereto from the pattern generator 120. When the read data is the same as the expected value data, the judging section 140 outputs a test result notifying that the DUT 100 passes the test. The control device 150 determines various settings of the comparator circuit 135. Specifically speaking, the control device 150 adjusts the delay amounts of variable delay circuits provided within the comparator circuit 135, in order to enable the comparator circuit 135 to read the data signal accurately. Depending on whether the DUT 100 is configured by employing source synchronous clocking, the control device 150 switches the operations of the comparator circuit 135.

Figure 2:
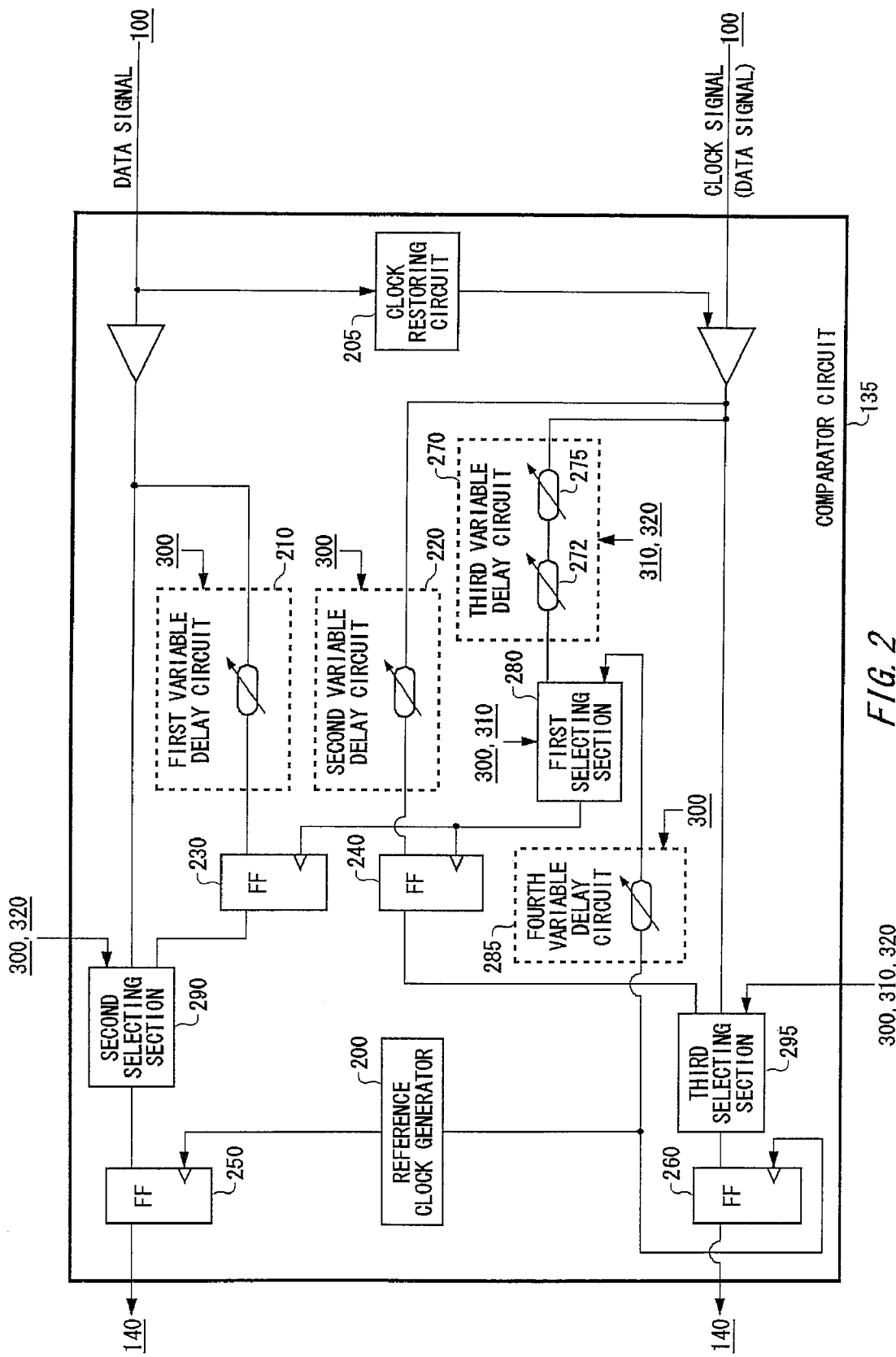
FIG. 2 illustrates the functional configuration of a comparator circuit 135.

FIG. 2 illustrates the functional configuration of the comparator circuit 135. The comparator circuit 135 includes therein a reference clock generator 200, a clock restoring circuit 205, a first variable delay circuit 210, a second variable delay circuit 220, a first flip-flop 230, a second flip-flop 240, a third flip-flop 250, a fourth flip-flop 260, a third variable delay circuit 270, a first selecting section 280, a fourth variable delay circuit 285, a second selecting section 290, and a third selecting section 295. The reference clock generator 200 generates the reference clock for the test apparatus 10. The reference clock generator 200 may supply the reference clock which is supplied from the timing generator 110 or the like, to the constituents of the comparator circuit 135. The clock restoring circuit 205 restores a clock signal from the data signal input into the comparator circuit 135 and supplies the restored clock signal to the constituents of the comparator circuit 135 as the input clock signal, in preparation for a case where the DUT 100 is not configured by employing source synchronous clocking. The first variable delay circuit 210 receives the data signal output from the DUT 100, delays the received data signal by a designated time, and outputs the delayed data signal. The second variable delay circuit 220 receives the clock signal which is output from the DUT 100 and indicates the timing at which the data signal should be obtained, delays the received clock signal by a designated time, and outputs the delayed clock signal as a first delayed clock signal. The delay amounts of these variable delay circuits can be set by a first delay adjusting section 300 described later in the description of the control device 150.

The first flip-flop 230 obtains the delayed data signal output from the first variable delay circuit 210 at a timing determined by the reference clock. Here, the timing of obtaining the signal may be later than the reference clock by a time equal to the delay amount of the fourth variable delay circuit 285. Similarly, the second flip-flop 240 obtains the first delayed clock signal output from the second variable delay circuit 220 at a timing determined by the reference clock. The second selecting section 290 selects one of the data signal output from the DUT 100 and the delayed data signal output from the first flip-flop 230, and supplies the selected data signal to the third flip-flop 250. The third flip-flop 250 obtains the signal output from the second selecting section 290 at a timing determined by the reference clock, and supplies the obtained signal to the judging section 140. The third selecting section 295 selects one of a different data signal output from the DUT 100 and the first delayed clock signal output from the third selecting section 295, and supplies the selected signal to the fourth flip-flop 260. The fourth flip-flop 260 obtains the signal output from the third selecting section 295 at a timing determined by the reference clock, and supplies the obtained signal to the judging section 140. The second and third selecting sections 290 and 295 may each receive a setting specifying a selection to be made between the signals, from a first delay adjusting section 300, a second delay adjusting section 310, and a test control section 320, which are described later.

The third variable delay circuit 270 is shown as an example of a phase varying section relating to the present invention. To generate a second delayed clock signal having a designated phase difference with respect to the clock signal output from the DUT 100, the third variable delay circuit 270 delays the clock signal by a designated time, and outputs the delayed clock signal as the second delayed clock signal. For example, the third variable delay circuit 270 may include therein an adjusting variable delay circuit 275 for adjusting the phase of the second delayed clock signal and a strobe variable delay circuit 272 for varying the strobe position of the delayed data signal which is determined by the second delayed clock signal. The first selecting section 280 selects one of the signal generated based on the reference clock and the second delayed clock signal, which is to be supplied to the first and second flip-flops 230 and 240. The fourth variable delay circuit 285 delays the reference clock by a designated delay amount, and supplies the delayed reference clock to the first selecting section 280.

In the above description with reference to FIG. 2, a case is assumed where the test is performed by using a single signal for each of the data and clock for the sake of intelligibility. When a more detailed test is desired, the comparator circuit 135 may alternatively generate, for each of the data and clock, a first signal indicating a result of judgment as to whether the logical value is true, and a second signal indicating a result of judgment as to whether the logical value is false. In this case, the first variable delay circuit 210 delays each of the first and second signals for the data. Similarly, the second variable delay circuit 220 delays each of the first and second signals for the clock. The first flip-flop 230 obtains the first and second signals for the data, and the second flip-flop 240 obtains the first and second signals for the clock. With the above configurations, the comparator circuit 135 can detect a transient status between a case where the logical value is true and a case where the logical value is false. As a result, the comparator circuit 135 enables the judging section 140 of a later stage to perform a more variety of tests.

Figure 3:
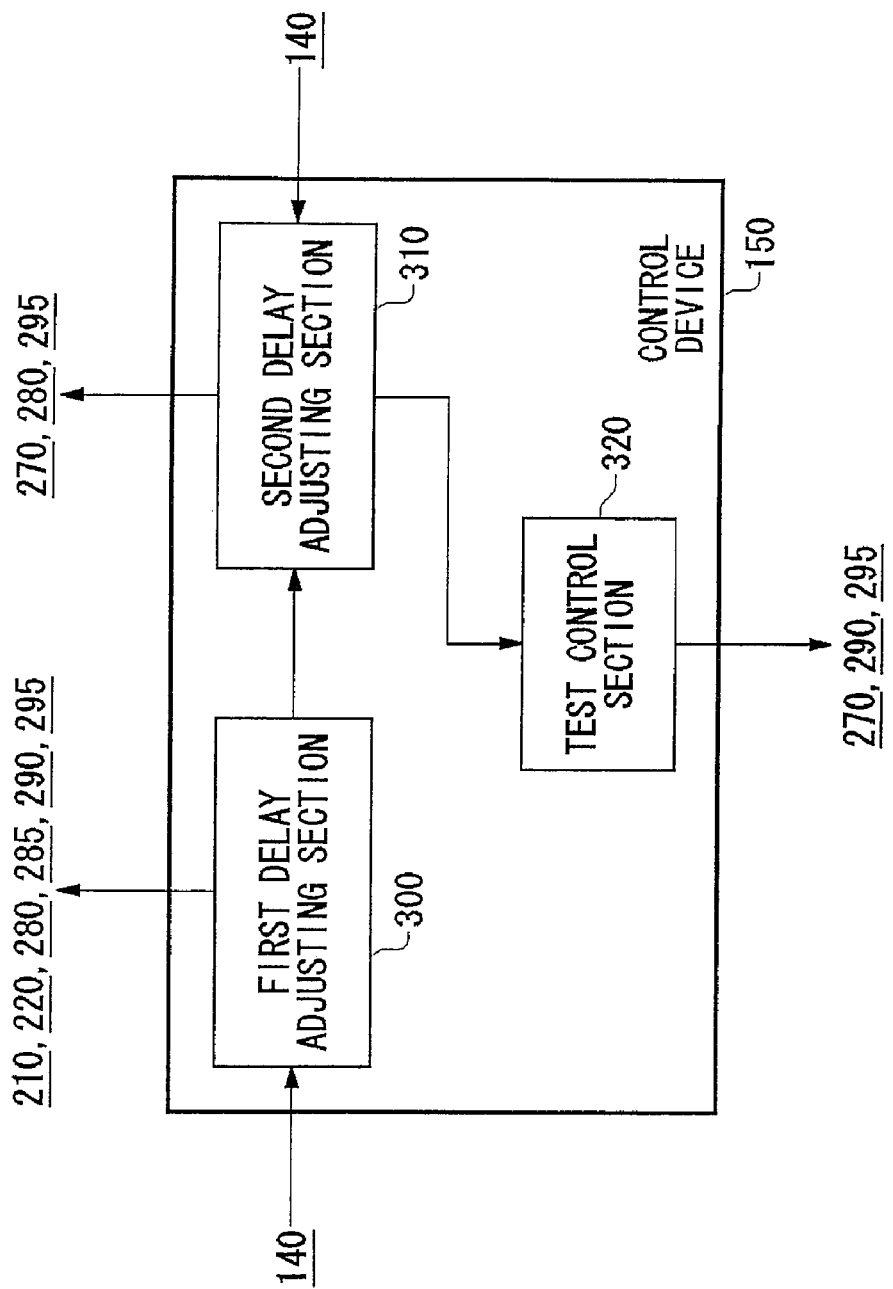
FIG. 3 illustrates the functional configuration of a control device 150.

FIG. 3 illustrates the functional configuration of the control device 150. The control device 150 includes therein the first delay adjusting section 300, second delay adjusting section 310, and test control section 320. The first delay adjusting section 300 configures the first selecting section 280 so as to select the signal generated based on the reference clock and supply the selected signal to the first and second flip-flops 230 and 240. The first delay adjusting section 300 configures the second selecting section 290 so as to select the signal output from the first flip-flop 230 and supply the selected signal to the third flip-flop 250. The first delay adjusting section 300 configures the third selecting section 295 to select the signal output from the second flip-flop 240 and supply the selected signal to the fourth flip-flop 260.

When the first, second and third selecting sections 280, 290 and 295 are configured in the above-mentioned manner, the first delay adjusting section 300 adjusts the phase difference between the input data and clock signals so as to be equal to a first phase difference, and outputs the adjusted data and clock signals as the delayed data signal and first delayed clock signal Were, the delayed data signal is shown as an example of a first data signal). For example, the first delay adjusting section 300 adjusts at least one of the delay amounts of the first and second variable delay circuits 210 and 220 so that the first and second flip-flops 230 and 240 obtain the delayed data signal and first delayed clock signal at the varying timing of a signal. As indicated by the above description, the first phase difference may be substantially equal to or larger than zero.

A specific example of the above adjusting operation is explained. To start with, the first delay adjusting section 300 causes the first and second flip-flops 230 and 240 to obtain the data signal and clock signal at a plurality of times, while varying the delay amounts of the first and second variable delay circuits 210 and 220. In this way, the first delay adjusting section 300 detects such a delay amount of the first variable delay circuit 210 that the numbers of times at which the logical values L and H of the data signal are obtained become substantially the same. Similarly, the first delay adjusting section 300 detects such a delay amount of the second variable delay circuit 220 that the numbers of times at which the logical values L and H of the clock signal are obtained become substantially the same. The first delay adjusting section 300 assigns the detected delay amounts to the first and second variable delay circuits 210 and 220. Alternatively, the first delay adjusting section 300 may adjust the delay amount of one of the first and second variable delay circuits 210 and 220, and the delay amount of the fourth variable delay circuit 285. To be specific, for example, the first delay adjusting section 300 causes the first and second flip-flops 230 and 240 to obtain the data and clock signals at a plurality of times, while varying the delay amounts of the first and fourth variable delay circuits 210 and 285. In this way, the first delay adjusting section 300 detects such a delay amount of the first variable delay circuit 210 that the numbers of times at which the logical values L and H of the data signal are obtained become substantially the same. Similarly, the first delay adjusting section 300 detects such a delay amount of the fourth variable delay circuit 285 that the numbers of times at which the logical values L and H of the clock signal are obtained become substantially the same. The first delay adjusting section 300 may then assign the detected delay amounts to the first and fourth variable delay circuits 210 and 285.

As another example, the first delay adjusting section 300 may use a phase difference comparator to detect the phase difference between the input data and clock signals. The phase difference comparator is configured so as to be input with two signals and output the phase difference between the received signals in the form of a logical or voltage value. In this case, the first delay adjusting section 300 compares the output value from the phase difference comparator with a predetermined reference value. When the output value is larger than the reference value, the first delay adjusting section 300 increases the delay amount of one of the first and second variable delay circuits 210 and 220, or decreases the delay amount of the other circuit. When the output value is smaller than the reference value, the first delay adjusting section 300 decreases the delay amount of one of the first and second variable delay circuits 210 and 220, which is increased when the output value is larger, or increases the delay amount of the other circuit. As described above, the phase comparison may be conducted based on other factors than the number of times at which the data signal is received.

The second delay adjusting section 310 starts operating on reception of notification from the first delay adjusting section 300 which indicates that the phase adjusting operation is completed. The second delay adjusting section 310 configures the first selecting section 280 so as to select the second delayed clock signal and supply the selected signal to the first and second flip-flops 230 and 240. The second delay adjusting section 310 maintains the configuration of the second selecting section 290 according to which the signal output from the first flip-flop 230 is selected and supplied to the third flip-flop 250. The second delay adjusting section 310 maintains the configuration of the third selecting section 295 according to which the signal output from the second flip-flop 240 is selected and supplied to the fourth flip-flop 260. When the first, second and third selecting sections 280, 290 and 295 are configured in the above-mentioned manner, the second delay adjusting section 310 adjusts the delay amount of the third variable delay circuit 270 based on the result of obtaining the first delayed clock signal whose phase is adjusted by the first delay adjusting section 300 at the varying timing of the second delayed clock signal. By doing this, the second delay adjusting section 310 adjusts the phase difference between the first and second delayed clock signals so as to be equal to a second phase difference. In the above-described manner, the phase difference between the delayed data signal and second delayed clock signal is adjusted so as to be equal to a total of the above-mentioned first and second phase differences, that is to say, a phase difference desired by the user.

Specifically speaking, for example, the second delay adjusting section 310 may adjust the delay amount of the adjusting variable delay circuit 275 while maintaining the delay amount of the strobe variable delay circuit 272 at a predetermined delay amount. Here, the second delay adjusting section 310 may determine the delay amount of the adjusting variable delay circuit 275 in such a manner that the varying timings of the first and second delayed clock signals substantially coincide with each other. After this, by returning the delay amount of the strobe variable delay circuit 272 to substantially zero, the second delay adjusting section 310 can generate a phase difference determined in accordance with the delay amount of the strobe variable delay circuit 272 between the first and second delayed clock signals.

The test control section 320 starts operating on reception of notification from the second delay adjusting section 310 which indicates that the phase adjusting operation is completed. The test control section 320 maintains the configuration of the first selecting section 280 according to which the second delayed clock signal is supplied to the first and second flip-flops 230 and 240. The test control section 320 maintains the configuration of the second selecting section 290 according to which the signal output from the first flip-flop 230 is selected and supplied to the third flip-flop 250. The test control section 320 maintains the configuration of the third selecting section 295 according to which the signal output from the second flip-flop 240 is selected and supplied to the fourth flip-flop 260. When the first, second and third selecting sections 280, 290 and 295 are configured in the above-mentioned manner, the test control section 320 sequentially receives the data signal output from the DUT 100. The test control section 320 may further delay the second delayed clock signal by adjusting the delay amount of the strobe variable delay circuit 272, to perform a timing test on the DUT 100. As a result, the test apparatus 10 can test whether the DUT 100 can normally operate, even when a signal delay occurs within a predetermined reference range.

Figure 4:
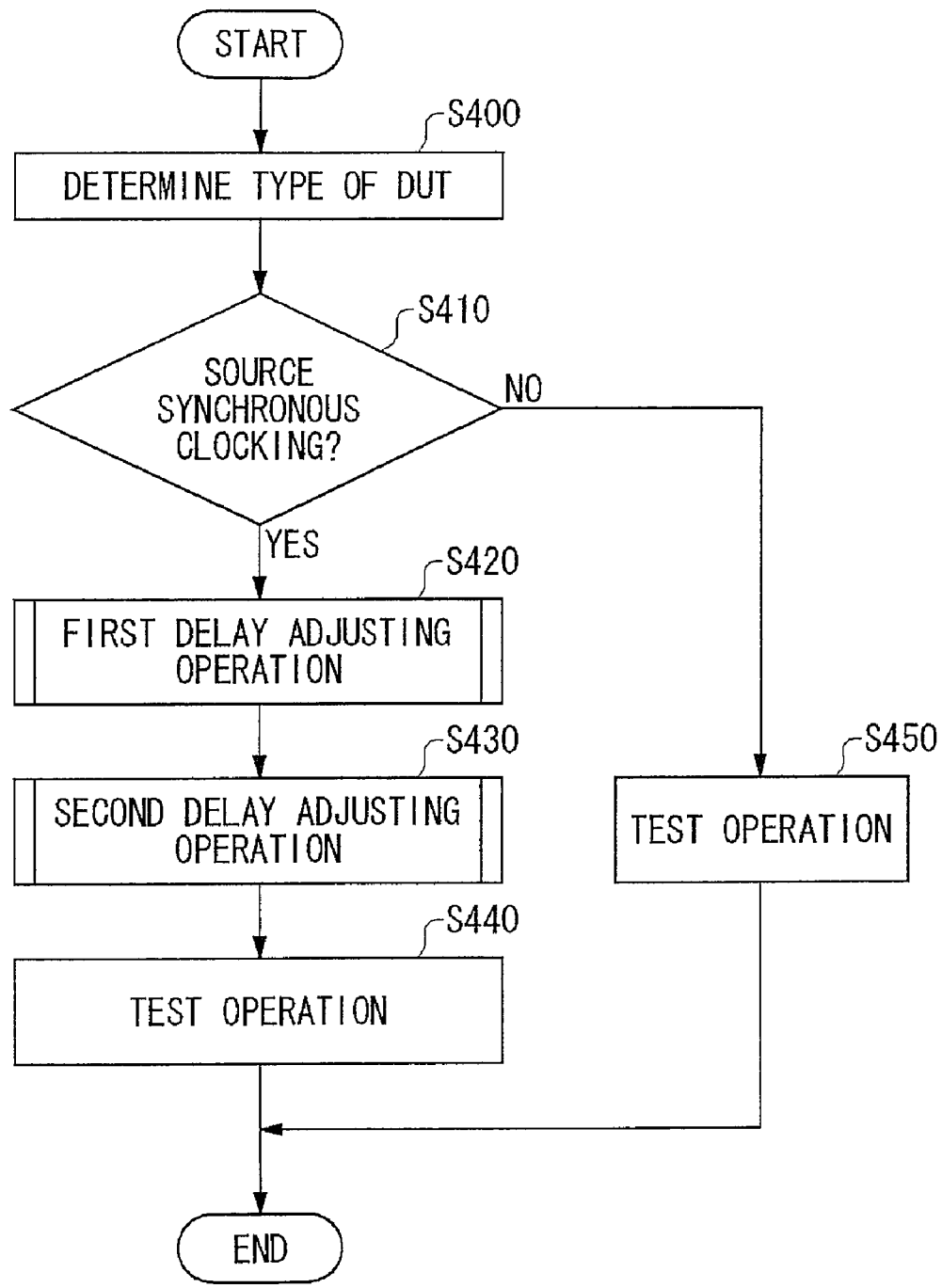
FIG. 4 is a flow chart illustrating a flow including adjusting operations performed prior to a test and a test operation.

FIG. 4 is a flow chart illustrating a flow including adjusting operations performed prior to a test and a test operation. To begin with, the test apparatus 10 determines the type of the DUT 100 (step S400). The type of the DUT 100 may be prestored on the test apparatus 10 in accordance with an input made by an engineer, or automatically determined by the test apparatus 10 based on an identifying signal output from the DUT 100. Under the condition that the DUT 100 employs source synchronous clocking (step S410:YES), the first delay adjusting section 300 performs a first delay adjusting operation (step S420). The first delay adjusting operation adjusts the first and second variable delay circuits 210 and 220 so that the first and second flip-flops 230 and 240 obtain the delayed data signal and first delayed clock signal at the varying timing of a signal. The first delay adjusting operation is performed by the first delay adjusting section 300, first variable delay circuit 210, and second variable delay circuit 220, which operate together so as to function as a first adjusting section relating to the present invention. To be specific, the first delay adjusting section 300, first variable delay circuit 210, and second variable delay circuit 220 operate together so as to adjust at least one of the phases of the input data and clock signals, and thus output the adjusted data and clock signals as the first delayed data signal and first delayed clock signal which have varying timings coinciding with each other.

Subsequently, the second delay adjusting section 310 performs a second delay adjusting operation (step S430). The second delay adjusting operation adjusts the third variable delay circuit 270 so that the first and second delayed clock signals have a desired phase difference therebetween. To be specific, the second delay adjusting section 310 may adjust the delay amount of the third variable delay circuit 270 so that the varying timing of the second delayed clock signal is positioned so as to coincide with the substantially middle point within the H or L level period of the first delayed clock signal. In this way, the second delayed clock signal can be adjusted so as to have such a phase that the comparator circuit 135 can receive the data signal most easily when the delay amount of the strobe variable delay circuit 272 is set to zero. As a result, the test apparatus 10 can perform a test in relation to each of the strobe positions determined with reference to this phase of the second delayed clock signal.

Subsequently, the test control section 320 and judging section 140 perform the test operation on the DUT 100 (step S440). To be specific, the test control section 320 maintains the configuration of the first selecting section 280 according to which the second delayed clock signal is supplied to the first and second flip-flops 230 and 240. The test control section 320 varies and adjusts the strobe position by adjusting the delay amount of the strobe variable delay circuit 272. The judging section 140 judges whether the DUT 100 passes or fails the test, based on the result of obtaining the delayed data signal at the varying timing of the second delayed clock signal while the delay amount of the strobe variable delay circuit 272 is varied. Specifically speaking, the judging section 140 judges whether the signal output from the DUT 100 passes or fails the test based on the result of comparing, with the expected value, the value of the signal which is output from the third flip-flop 250 when the second selecting section 290 is configured to select the signal output from the first flip-flop 230.

On the other hand, under the condition that the DUT 100 does not employ source synchronous clocking, that is to say, that a different DUT than the DUT 100 shown as an example in FIG. 1 is mounted on the test apparatus 10 (step S410:NO), the test control section 320 and judging section 140 performs a test operation on the mounted DUT (step S450). This type of DUT outputs a first data signal and a second data signal in place of the data and clock signals. The test control section 320 configures the second selecting section 290 so as to select the first data signal, and configures the third selecting section 295 to select the second data signal. The judging section 140 judges whether the signal output from the DUT 100 passes or fails the test based on the result of comparing, with respective expected values, the values of the signals which are output from the third and fourth flip-flops 250 and 260 when the second and third selecting sections 290 and 295 are configured in the above manner.

Figure 5:
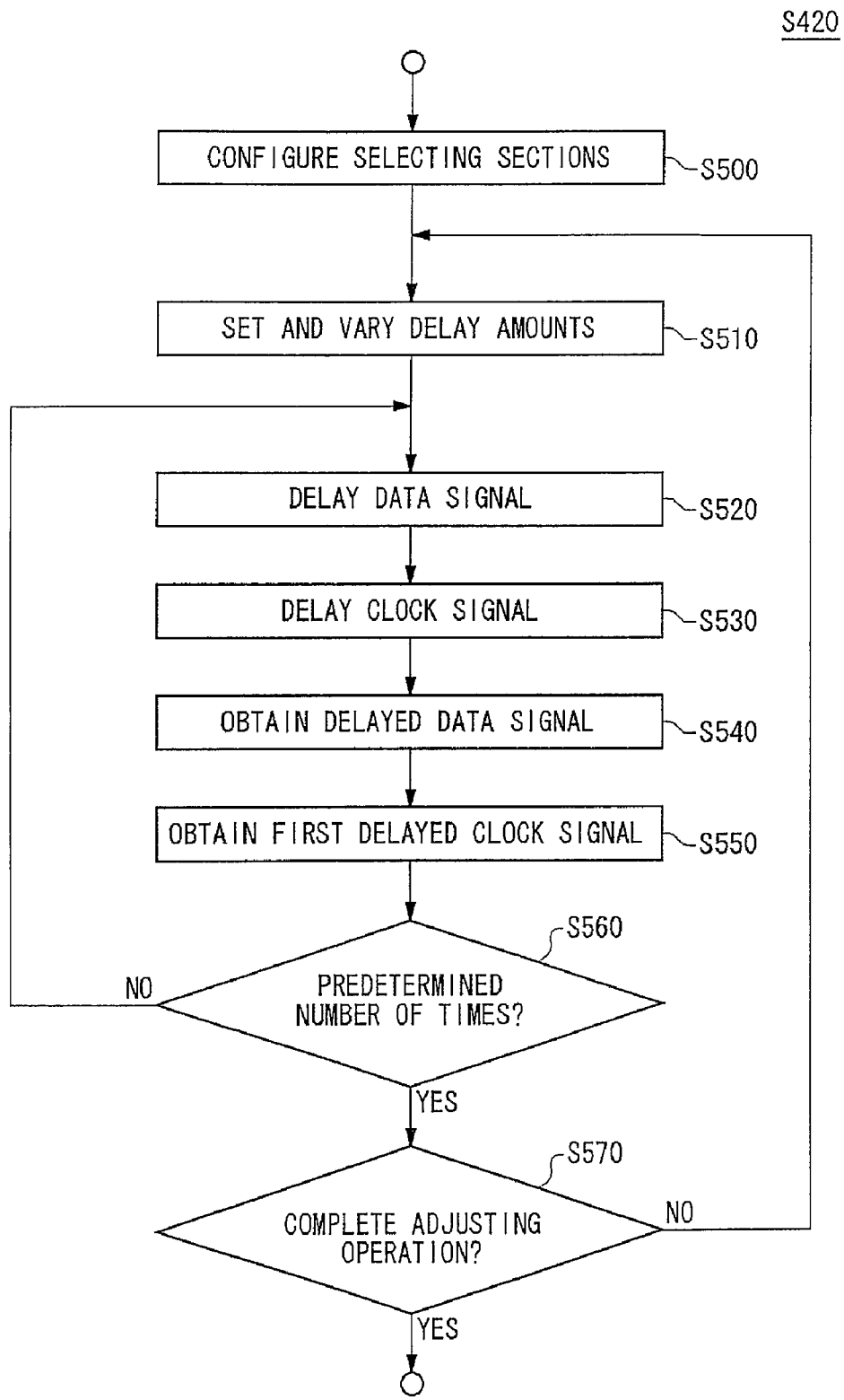
FIG. 5 is a flow chart illustrating a flow of a first delay adjusting operation.

FIG. 5 is a flow chart illustrating the flow of the first delay adjusting operation. The first delay adjusting section 300 configures the first selecting section 280 so as to supply the signal generated based on the reference clock to the first and second flip-flops 230 and 240 (step S500). The first delay adjusting section 300 configures the second selecting section 290 so as to select the signal output from the first flop 230 and supply the selected signal to the third flip-flop 250. The first delay adjusting section 300 configures the third selecting section 295 so as to select the signal output from the second flip-flop 240 and supply the selected signal to the fourth flip-flop 260. Subsequently, the first delay adjusting section 300 performs the following procedure to vary at least one of the delay amounts of the first and second variable delay circuits 210 and 220.

The first delay adjusting section 300 sets, at a predetermined delay amount, at least one of the delay amounts of the first and second variable delay circuits 210 and 220 (step S510). Specifically speaking, the first variable delay circuit 210 delays the data signal output from the DUT 100 by a designated time, and outputs the delayed data signal (step S520). The second variable delay circuit 220 delays, by a designated time, the clock signal which is output from the DUT 100 and indicates the timing at which the data signal is obtained, and outputs the resulting signal as the first delayed clock signal (step S530). The first flip-flop 230 obtains the delayed data signal at a timing determined by the reference clock (step S540). The second flip-flop 240 obtains the first delayed clock signal at a timing determined by the reference clock (step S550). The above-described operations are repeated until the number of times at which each of the delayed data signal and first delayed clock signal is obtained reaches a predetermined number (step S560).

When the number of times at which each of the delayed data signal and first delayed clock signal is obtained reaches the predetermined number (step S560:YES), the first delay adjusting section 300 judges whether a phase adjusting operation is completed for the delayed data signal and first delayed clock signal (step S570). For example, when the numbers of times at which the logical values L and H of the data signal are obtained become substantially the same and the numbers of times at which the logical values L and H of the clock signal are obtained become substantially the same, the first delay adjusting section 300 may judge that the phase adjusting operation is completed for the delayed data signal and first delayed clock signal. When the phase adjusting operation is not completed (step S570:NO), the first delay adjusting section 300 next performs the operations in the step S510 and subsequent steps, so as to vary the delay amounts of the first and second variable delay circuits 210 and 220. When the phase adjusting operation is completed (step S570:YES), the procedure illustrated in FIG. 5 ends.

Figure 6:
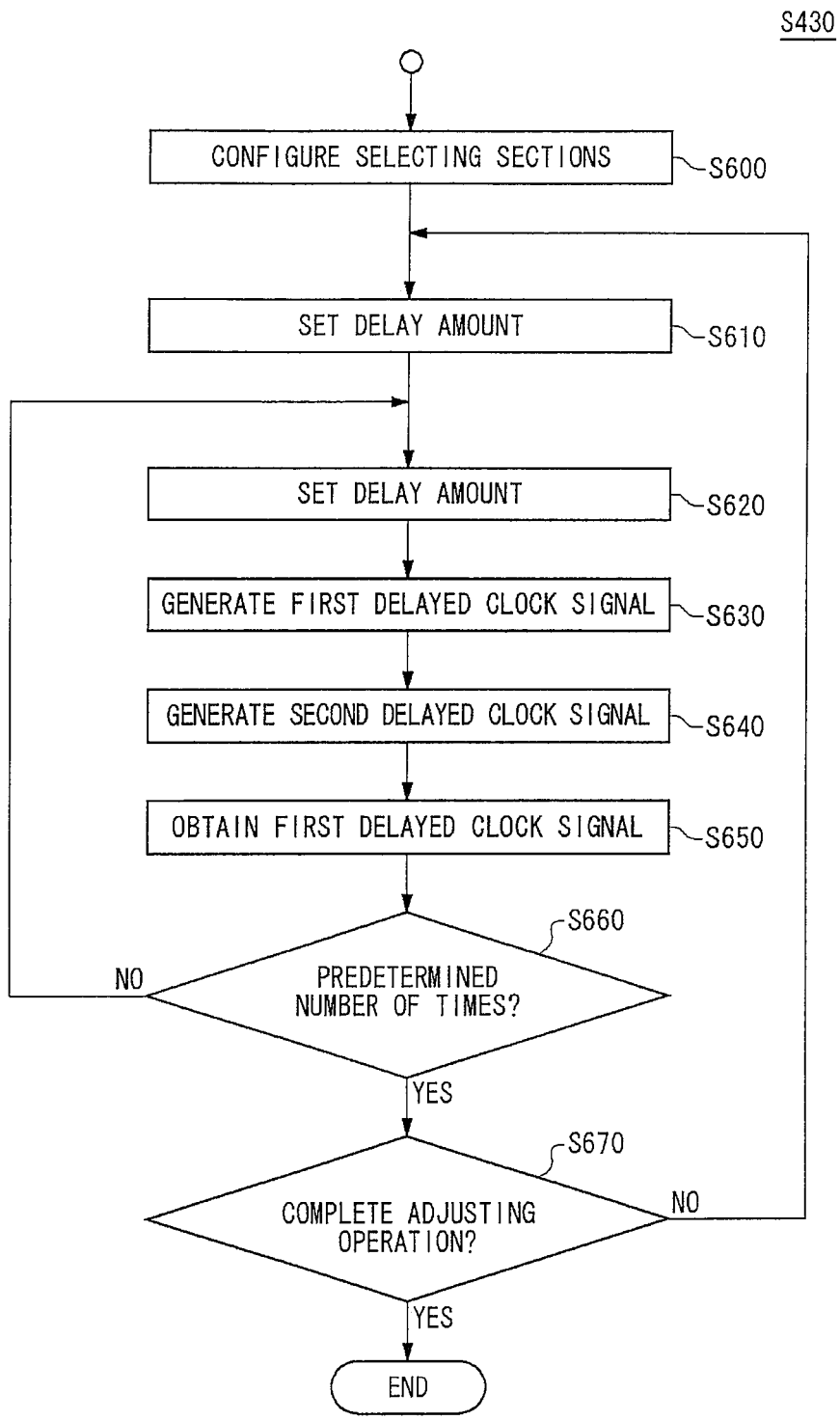
FIG. 6 is a flow chart illustrating a flow of a second delay adjusting operation.

FIG. 6 is a flow chart illustrating the flow of the second delay adjusting operation. When receiving the notification from the first delay adjusting section 300 which indicates that the phase adjusting operation is completed, the second delay adjusting section 310 starts the following procedure. To start with, the second delay adjusting section 310 configures the first selecting section 280 so as to supply the second delayed clock signal to the first and second flip-flops 230 and 240 (step S600). The second delay adjusting section 310 maintains the configuration of the second selecting section 290 according to which the signal output from the first flip-flop 230 is selected and supplied to the third flip-flop 250. The second delay adjusting section 310 maintains the configuration of the third selecting section 295 according to which the signal output from the second flip-flop 240 is selected and supplied to the fourth flip-flop 260.

Subsequently, the second delay adjusting section 310 sets, at a predetermined delay amount, the delay amount of the strobe variable delay circuit 272 (step S610). With this state being maintained, the second delay adjusting section 310 performs the following procedure to adjust the delay amount of the adjusting variable delay circuit 275. To start with, the second delay adjusting section 310 sets, at a predetermined delay amount, the delay amount of the adjusting variable delay circuit 275 (step S620). The second variable delay circuit 220 delays, by a designated time, the clock signal which is output from the DUT 100 and indicates the timing at which the data signal is obtained, and outputs the resulting signal as the first delayed clock signal (step S630). The third variable delay circuit 270 delays the clock signal by a designated time, and outputs the resulting signal as the second delayed clock signal (step S640). The second flip-flop 240 obtains the first delayed clock signal at a tiring designated by the second delayed clock signal (step S650). The above-described procedure is repeated until the number of times at which the first delayed clock signal is obtained reaches a predetermined number (step S660).

When the number of times at which the first delayed clock sign is obtained reaches the predetermined number (step S660:YES), the second delay adjusting section 310 judges whether a phase adjusting operation is completed for the second delayed clock signal (step S670). For example, when the numbers of times at which the logical values L and H of the clock signal are obtained become substantially the same, the second delay adjusting section 310 may judge that the phase adjusting operation is completed for the second delayed clock signal. When the phase adjusting operation is not completed (step S670:NO), the second delay adjusting section 310 next performs the operations in the step S610 and subsequent steps, so as to vary the delay amount of the third variable delay circuit 270. When the phase adjusting operation is completed (step S670:YES), the procedure shown in FIG. 6 ends.

Figure 7:
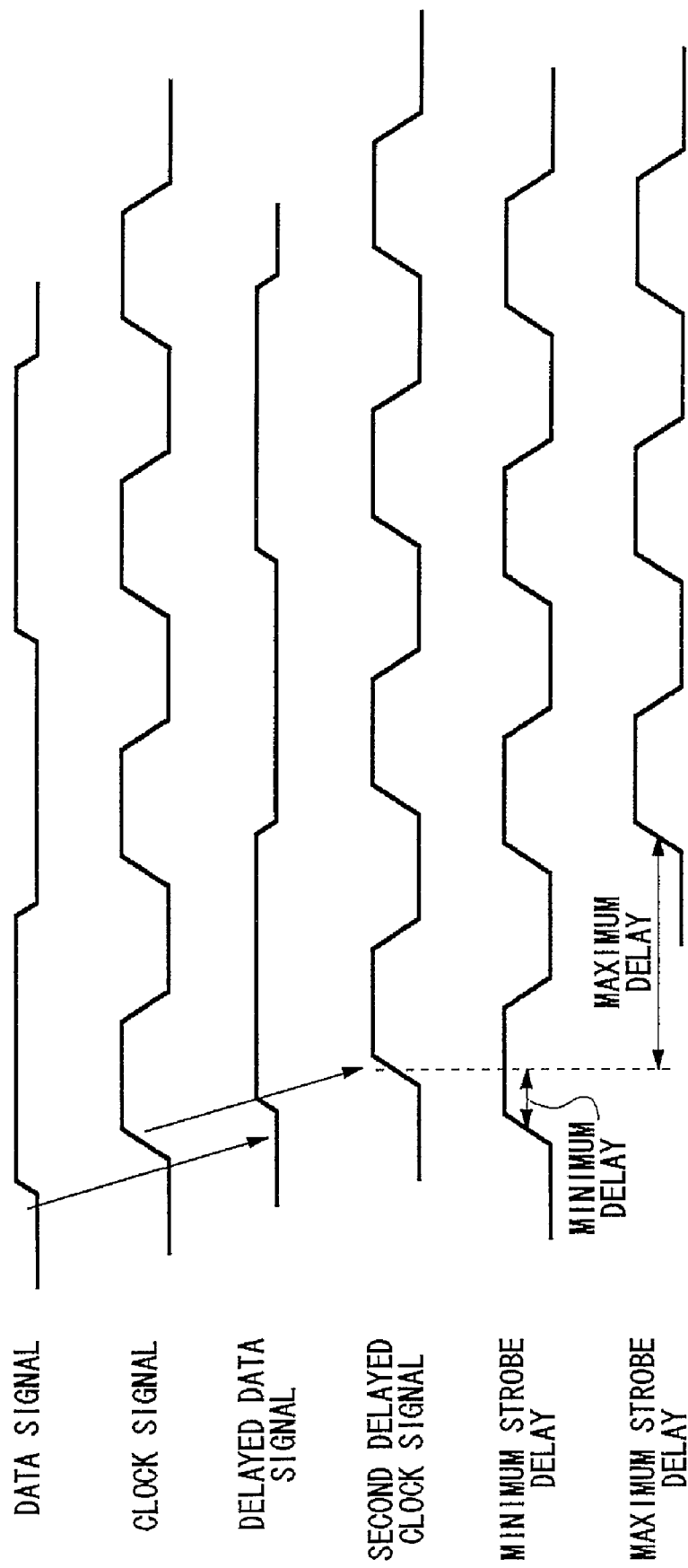
FIG. 7 is a timing chart for signals the delay amounts of which are adjusted.

FIG. 7 is a timing chart illustrating the signals the delay amounts of which are adjusted. The data signal output from the DUT 100 is delayed by the first variable delay circuit 210, and output as the delayed data signal. On the other hand, the clock signal output from the DUT 100 is delayed by the second variable delay circuit 220, and output as the first delayed clock signal. The second delayed clock signal is adjusted by the third variable delay circuit 270 so as to have a desired phase difference with respect to the first delayed clock signal. In this way, the second delayed clock signal is synchronized with the clock signal. Therefore, the test apparatus 10 can maintain the accuracy of the test even when jitter occurs in the output signal from the DUT 100. When the strobe delay is set to a minimum value by the strobe variable delay circuit 272, the varying point of the second delayed clock signal becomes earlier. When the strobe delay is set to a maximum value by the strobe variable delay circuit 272, the varying point of the second delayed clock signal becomes later. As clarified above, the test apparatus 10 can adjust the strobe position with reference to the clock signal output from the DUT 100. Therefore, the test apparatus 10 can achieve higher accuracy in making the judgment as to whether the DUT 100 passes or fails the timing test.

Figure 8:
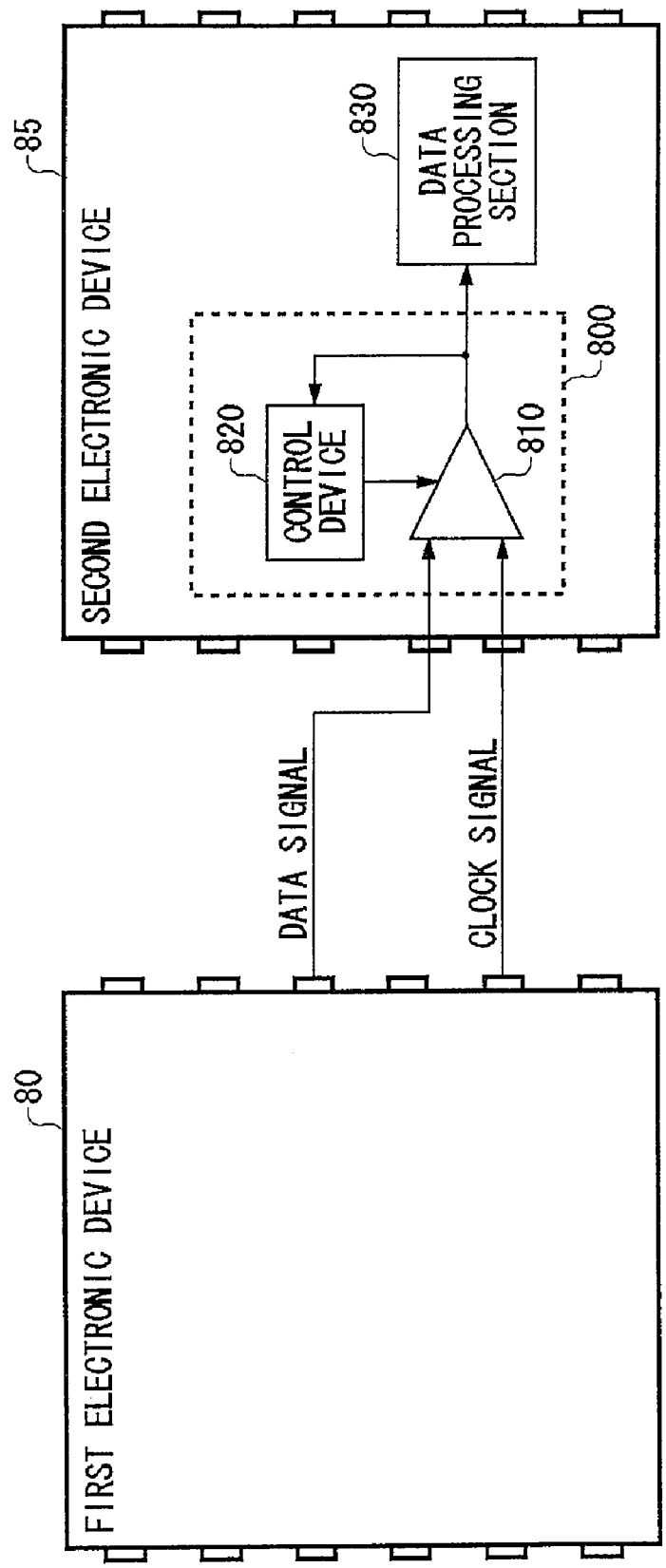
FIG. 8 illustrates the configuration of a function to realize data transfer between a first electronic device 80 and a second electronic device 85.

FIG. 8 illustrates the configuration of a function to realize data transfer between a first electronic device 80 and a second electronic device 85. With reference to FIG. 8, the following describes the configuration in which the second electronic device 85 operates in synchronization with the first electronic device 80 which is provided external to the second electronic device 85, and receives the signal output from the first electronic device 80 at an appropriate timing. In FIG. 8, the first and second electronic devices 80 and 85 are shown as two separate devices. Alternatively, however, the first and second electronic devices 80 and 85 may be formed on the same chip as a single unit, and the second electronic device 85 may receive a signal from the first electronic device 80 provided on the same chip.

The first electronic device 80 employs source synchronous clocking. The first electronic device 80 therefore outputs a clock signal and a data signal synchronized with the clock signal to the second electronic device 85. The second electronic device 85 includes therein a receiving circuit 800 and a data processing section 830. The receiving circuit 800 receives data from the first electronic device 80 by reading the input data signal in synchronization with the clock signal input by the first electronic device 80. The data processing section 830 performs an operation based on the read data signal. When the first electronic device 80 does not employ source synchronous clocking, the receiving circuit 800 may obtain only the data signal from the first electronic device 80, and obtain the clock signal from a different external device or internal clock generator. For example, the receiving circuit 800 may obtain a clock signal by restoring a clock from the data signal, and supply the obtained clock signal to a comparator circuit 810 as the input clock signal.

The receiving circuit 800 includes therein the comparator circuit 810 and a control device 820. The comparator circuit 810 reads the input data signal in synchronization with the clock signal input thereto by the first electronic device 80. The control device 820 determines a variety of settings of the comparator circuit 810. To be specific, the control device 820 adjusts the delay amounts of variable delay circuits provided within the comparator circuit 810 in such a manner as to enable the comparator circuit 810 to accurately read the data signal.

Figure 9:
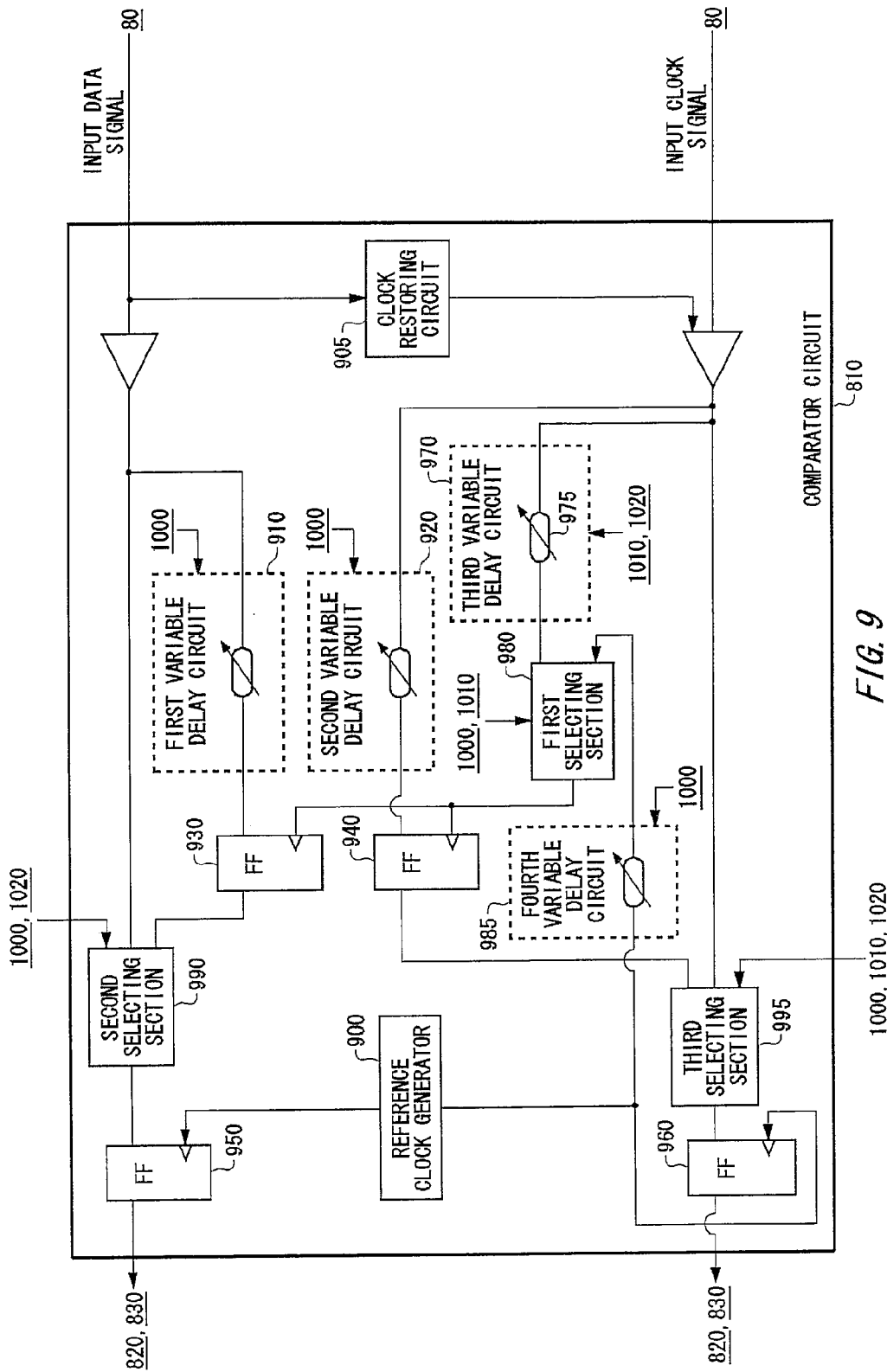
FIG. 9 illustrates the functional configuration of a comparator circuit 810.

FIG. 9 illustrates the functional configuration of the comparator circuit 810. The comparator circuit 810 includes therein a reference clock generator 900, a clock restoring circuit 905, a first variable delay circuit 910, a second variable delay circuit 920, a first flip-flop 930, a second flip-flop 940, a third flip-flop 950, a fourth flip-flop 960, a third variable delay circuit 970, a first selecting section 980, a fourth variable delay circuit 985, a second selecting section 990, and a third selecting section 995. The reference clock generator 900 generates a reference clock for the comparator circuit 810. The reference clock generator 900 may receive a reference clock from an external device or the like, and supply the received reference clock to the constituents of the comparator circuit 810. The clock restoring circuit 905 restores the input clock signal from the input data signal, in preparation for a case where the first electronic device 80 does not employ source synchronous clocking. The first variable delay circuit 910 delays the data signal output from the first electronic device 80 by a designated time, and outputs the delayed data signal. The second variable delay circuit 920 delays, by a designated time, the clock signal which is output from the first electronic device 80 and indicates the timing at which the data signal is obtained, and outputs the resulting signal as a first delayed clock signal. The delay amounts of the above-described variable delay circuits are set by a first delay adjusting section 1000, which is explained later in the section of describing the control device 820.

The first flip-flop 930 is shown as an example of a data obtaining section relating to the present invention. The first flip-flop 930 obtains the delayed data signal output from the first variable delay circuit 910 at a timing determined by the reference clock. Here, the timing of obtaining the signal may be later than the reference clock by a time equal to the delay amount of the fourth variable delay circuit 985. Similarly, the second flip-flop 940 obtains the first delayed clock signal output from the second variable delay circuit 920 at a timing determined by the reference clock. The second selecting section 990 selects one of the data signal output from the first electronic device 80 and the delayed data signal output from the first flip-flop 930, and supplies the selected signal to the third flip-flop 950. The third flip-flop 950 obtains the signal output from the second selecting section 990 at a timing determined by the reference clock and supplies the obtained signal to the control device 820 and data processing section 830. The third selecting section 995 selects one of a different data signal output from the first electronic device 80 and the first delayed clock signal output from the third selecting section 995, and supplies the selected signal to the fourth flip-flop 960. The fourth flip-flop 960 obtains the signal output from the third selecting section 995 at a timing determined by the reference clock, and supplies the obtained signal to the control device 820 and data processing section 830. The second and third selecting sections 990 and 995 each may receive a setting specifying a selection to be made between the signals, from a first delay adjusting section 1000, a second delay adjusting section 1010, and a test control section 1020, which are described later.

The third variable delay circuit 970 is shown as an example of the phase varying section relating to the present invention. To generate a second delayed clock signal having a designated phase difference with respect to the clock signal output from the first electronic device 80, the third variable delay circuit 970 delays the clock signal by a designated time, and outputs the delayed clock signal as the second delayed clock signal. For example, the third variable delay circuit 970 may include therein an adjusting variable delay circuit 975 for adjusting the phase of the second delayed clock signal. Alternatively, the third variable delay circuit 970 may generate the second delayed clock signal which is delayed by a designated time with respect to the input clock signal, by delaying the first delayed clock signal. The first selecting section 980 selects one of the signal generated based on the reference clock and the second delayed clock signal which is to be supplied to the first and second flip-flops 930 and 940. The fourth variable delay circuit 985 delays the reference clock by a designated delay amount, and supplies the delayed reference clock to the first selecting section 980.

In the above description with reference to FIG. 2, a case is assumed where the test is performed by using a single signal for each of the data and clock, for the sake of intelligibility. When a more detailed test is desired, the comparator circuit 810 may alternatively generate, for each of the data and clock, a first signal indicating a result of judgment as to whether the logical value is true, and a second signal indicating a result of judgment as to whether the logical value is false. In this case, the first variable delay circuit 910 delays each of the first and second signals for the data. Similarly, the second variable delay circuit 920 delays each of the first and second signals for the clock. The first flip-flop 930 obtains the first and second signals for the data, and the second flip-flop 940 obtains the first and second signals for the clock. With the above configurations, the comparator circuit 810 can detect a transient status between a case where the logical value is true and a case where the logical value is false.

Figure 10:
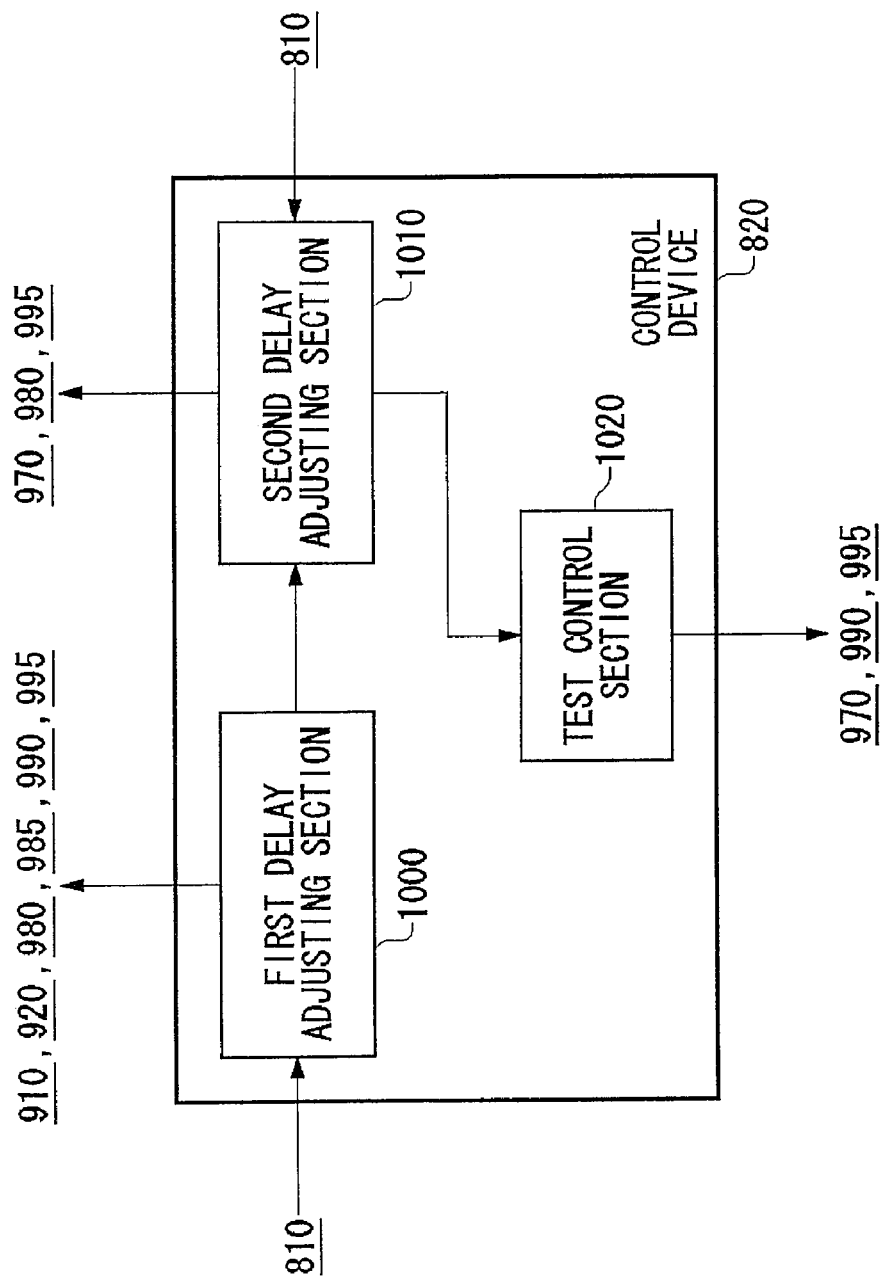
FIG. 10 illustrates the functional configuration of a control device 820.

FIG. 10 illustrates the functional configuration of the control device 820. The control device 820 includes therein a first delay adjusting section 1000, a second delay adjusting section 1010, and a test control section 1020. The first delay adjusting section 1000 configures the first selecting section 980 so as to select the signal generated based on the reference clock and supply the selected signal to the first and second flip-flops 930 and 940. The first delay adjusting section 1000 configures the second selecting section 990 so as to select the signal output from the first flip-flop 930 and supply the selected signal to the third flip-flop 950. The first delay adjusting section 1000 configures the third selecting section 995 so as to select the signal output from the second flip-flop 940 and supply the selected signal to the fourth flip-flop 960.

When the first, second and third selecting sections 980, 990 and 995 are configured in the above-mentioned manner, the first delay adjusting section 1000 adjusts the phase difference between the input data and clock signals so as to be equal to a first phase difference, and outputs the adjusted data and clock signals as the delayed data signal and first delayed clock signal. For example, the first delay adjusting section 1000 adjusts at least one of the delay amounts of the first and second variable delay circuits 910 and 920 so that the first and second flip-flops 930 and 940 obtain the delayed data signal and first delayed clock signal at the varying timing of a signal. As indicated by the above description, the first phase difference may be substantially equal to or larger than zero.

This delay adjusting operation is performed by the first delay adjusting section 1000, first variable delay circuit 910, and second variable delay circuit 920, which operate together so as to function as the first adjusting section relating to the present invention. To be specific, the first delay adjusting section 1000, first variable delay circuit 910, and second variable delay circuit 920 operate together so as to adjust at least one of the phases of the input data and clock signals, and thus output the adjusted data and clock signals as the first delayed data signal and first delayed clock signal which have varying timings coinciding with each other.

A specific example of the above adjusting operation is explained. To start with, the first delay adjusting section 1000 causes the first and second flip-flops 930 and 940 to obtain the data signal and clock signal at a plurality of times, while varying the delay amounts of the first and second variable delay circuits 910 and 920. In this way, the first delay adjusting section 1000 detects such a delay amount of the first variable delay circuit 910 that the numbers of times at which the logical values L and H of the data signal are obtained become substantially the same. Similarly, the first delay adjusting section 1000 detects such a delay amount of the second variable delay circuit 920 that the numbers of times at which the logical values L and H of the clock signal are obtained become substantially the same. The first delay adjusting section 1000 assigns the detected delay amounts to the first and second variable delay circuits 910 and 920. Alternatively, the first delay adjusting section 1000 may adjust the delay amount of one of the first and second variable delay circuits 910 and 920, and the delay amount of the fourth variable delay circuit 985. To be specific, for example, the first delay adjusting section 1000 causes the first and second flip-flops 930 and 940 to obtain the data and clock signals at a plurality of times, while varying the delay amounts of the first and fourth variable delay circuits 910 and 985. In this way, the first delay adjusting section 1000 detects such a delay amount of the first variable delay circuit 910 that the numbers of times at which the logical values L and H of the data signal are obtained become substantially the same. Similarly, the first delay adjusting section 1000 detects such a delay amount of the fourth variable delay circuit 985 that the numbers of times at which the logical values L and H of the clock signal are obtained become substantially the same. The first delay adjusting section 1000 may assign the detected delay amounts to the first and fourth variable delay circuits 910 and 985.

As another example, the first delay adjusting section 1000 may use a phase difference comparator to detect the phase difference between the input data and clock signals. The phase difference comparator is configured so as to be input with two signals and output the phase difference between the received signals in the form of a logical or voltage value. In this case, the first delay adjusting section 1000 compares the output value from the phase difference comparator with a predetermined reference value. When the output value is larger than the reference value, the first delay adjusting section 1000 increases the delay amount of one of the first and second variable delay circuits 910 and 920, or decreases the delay amount of the other circuit. When the output value is smaller than the reference value, the first delay adjusting section 1000 decreases the delay amount of one of the first and second variable delay circuits 910 and 920, which is increased when the output value is larger, or increases the delay amount of the other circuit. As described above, the phase comparison may be conducted based on other factors than the number of times at which the data signal is received.

The second delay adjusting section 1010 starts operating on reception of notification from the first delay adjusting section 1000 which indicates that the phase adjusting operation is completed. The second delay adjusting section 1010 configures the first selecting section 980 so as to select the second delayed clock signal and supply the selected signal to the first and second flip-flops 930 and 940. The second delay adjusting section 1010 maintains the configuration of the second selecting section 990 according to which the signal output from the first flip-flop 930 is selected and supplied to the third flip-flop 950. The second delay adjusting section 1010 maintains the configuration of the third selecting section 995 according to which the signal output from the second flip-flop 940 is selected and supplied to the fourth flip-flop 960. When the first, second and third selecting sections 980, 990 and 995 are configured in the above-mentioned manner, the second delay adjusting section 1010 adjusts the delay amount of the third variable delay circuit 970 based on the result of obtaining the first delayed clock signal whose phase is adjusted by the first delay adjusting section 1000 at the varying timing of the second delayed clock signal. By doing this, the second delay adjusting section 1010 adjusts the phase difference between the first and second delayed clock signals so as to be equal to the second phase difference. In the above-described manner, the phase difference between the delayed data signal and second delayed clock signal is adjusted so as to be equal to a total of the above-mentioned first and second phase differences, that is to say, a phase difference desired by the user.

The test control section 1020 starts operating on reception of notification from the second delay adjusting section 1010 which indicates that the phase adjusting operation is completed. The test control section 1020 maintains the configuration of the first selecting section 980 according to which the second delayed clock signal is supplied to the first and second flip-flops 930 and 940. The test control section 1020 maintains the configuration of the second selecting section 990 according to which the signal output from the first flip-flop 930 is selected and supplied to the third flip-flop 950. The test control section 1020 maintains the configuration of the third selecting section 995 according to which the signal output from the second flip-flop 940 is selected and supplied to the fourth flip-flop 960. When the first, second and third selecting sections 980, 990 and 995 are configured in the above-mentioned manner, the test control section 1020 sequentially receives the data signal output from the first electronic device 80. In this way, the first flip-flop 930 obtains the delayed data signal at the varying timing of the second delayed clock signal, so as to receive data from the first electronic device 80. According to the example shown in FIG. 10, the delayed data signal is received by the first flip-flop 930. However, a different flip-flop than the first flip-flop 930 may obtain the delayed data signal, under the condition that the delayed data signal is received at the varying timing of the second delayed clock signal.

Figure 11:
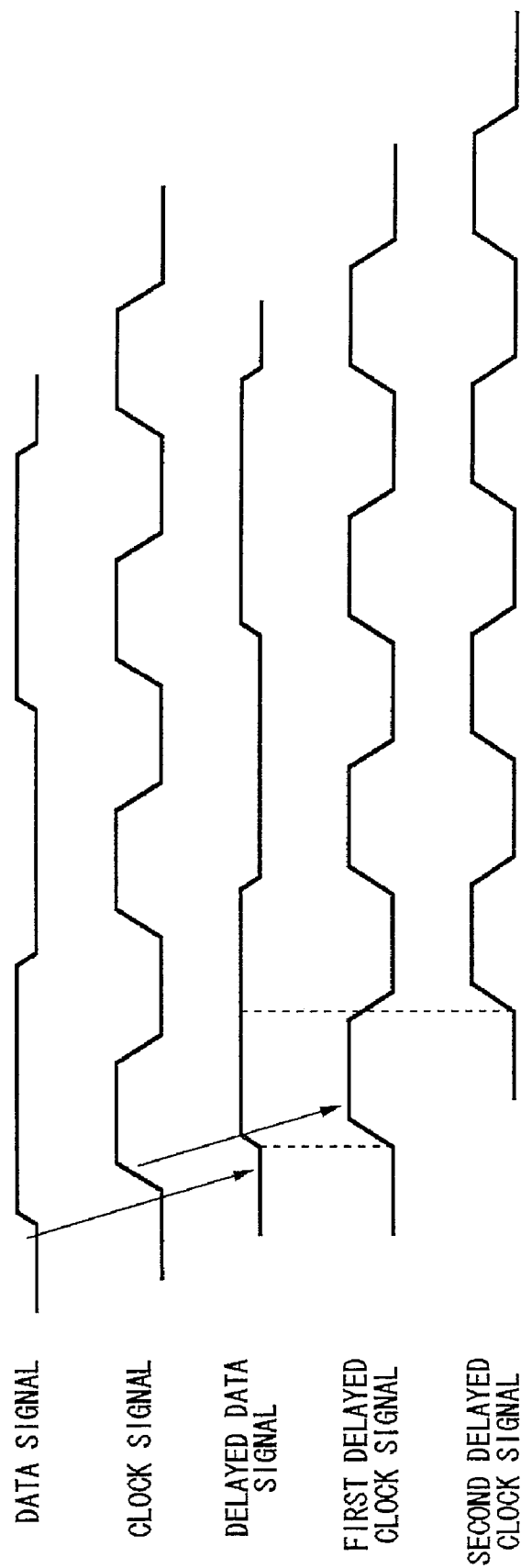
FIG. 11 is a timing chart for signals the delay amounts of which are adjusted.

FIG. 11 is a timing chart illustrating the signals the delay amounts of which are adjusted. The data signal output from the first electronic device 80 is delayed by the first variable delay circuit 910, and output as the delayed data signal. On the other hand, the clock signal output from the first electronic device 80 is delayed by the second variable delay circuit 920, and output as the first delayed clock signal. The second delayed clock signal is adjusted by the third variable delay circuit 970 so as to have a desired phase difference with respect to the first delayed clock signal. For example, if the rising timing of the second delayed clock signal is adjusted so as to come after the delayed data signal has risen and become stable as illustrated in FIG. 11, the delayed data signal can be reliably obtained. In addition, since the second delayed clock signal is synchronized with the clock signal, the second delayed clock signal is likely to be synchronized with the delayed data signal. As a result the second electronic device 85 can reliably obtain the data signal even when jitter occurs in the output signal from the first electronic device 80.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

As is apparent from the above description, one embodiment of the present invention can realize a test apparatus, a circuit and an electronic device which can accurately judge whether an electronic device configured by employing source synchronous clocking passes or fails a test.

What is claimed is:

1. An electronic device for receiving an input data signal and an input clock signal that indicates a timing to obtain the input data signal, the electronic device comprising:
   a first adjusting section that adjusts a phase difference between the input data signal and the input clock signal so as to be equal to a first phase difference, and outputs the resulting signals as a first data signal and a first clock signal;
   a phase varying section that outputs a second clock signal having a designated phase difference with respect to the first clock signal; and
   a second adjusting section that adjusts the phase difference of the second clock signal with respect to the first clock signal so as to be equal to a second phase difference, based on a result of obtaining the first clock signal at a varying timing of the second clock signal.

2. The electronic device as set forth in claim 1, further comprising:
   a receiving circuit that receives the input data signal and the input clock signal, to receive data; and
   a data obtaining section that obtains the first data signal at the varying timing of the second clock signal, to receive data, wherein
   the receiving circuit includes:
   the first adjusting section; and
   the phase varying section.

3. The electronic device as set forth in claim 2, wherein the electronic device receives the input data signal and the input clock signal from an external device.

4. The electronic device as set forth in claim 2, wherein the electronic device:
   receives the input data signal from an external device; and
   further includes a clock restoring circuit that restores the input clock signal from the input data signal, and
   the receiving circuit receives the input data signal that is received from the external device and the input clock signal that is restored by the clock restoring circuit, to receive data.

5. The electronic device as set forth in claim 1, wherein the first adjusting section adjusts at least one of phases of the input data signal and the input clock signal, and outputs the resulting signals as the first data signal and the first clock signal which have varying timings coinciding with each other,
   the phase varying section includes a variable delay circuit that delays the input clock signal by a designated time, and outputs the delayed input clock signal as the second clock signal,
   the second adjusting section adjusts a delay amount of the variable delay circuit based on the result of obtaining the first clock signal at the varying timing of the second clock signal, so as to adjust the phase difference of the second clock signal with respect to the first clock signal to be equal to a desired phase difference, and
   the electronic device receives a signal from the external device by obtaining the first data signal at the varying timing of the second clock signal.

6. An electronic device for receiving a signal from an external device, comprising:
   a reference clock generator that generates a reference clock;
   a first variable delay circuit that delays a data signal output from the external device by a designated time, and outputs the delayed data signal;

a second variable delay circuit that delays, by a designated time, a clock signal which is output from the external device and indicates a timing at which the data signal is obtained, and outputs the delayed clock signal as a first delayed clock signal;

a first flip-flop that obtains the delayed data signal at a timing determined by the reference clock;

a second flip-flop that obtains the first delayed clock signal at a timing determined by the reference clock;

a first delay adjusting section that adjusts at least one of delay amounts of the first and second variable delay circuits so that the first and second flip-flops respectively obtain the delayed data signal and first delayed clock signal at a varying timing of a signal;

a third variable delay circuit that delays the clock signal by a designated time, and outputs the delayed clock signal as a second delayed clock signal; and a second delay adjusting section that adjusts a phase difference between the first and second delayed clock signals so as to be equal to a desired phase difference, by adjusting a delay amount of the third variable delay circuit based on a result of obtaining the first delayed clock signal whose phase is adjusted by the first delay adjusting section at a varying timing of the second delayed clock signal, wherein the electronic device receives the signal from the external device by obtaining the delayed data signal at the varying timing of the second delayed clock signal.

7. A circuit for receiving an input data signal from a device and an input clock signal indicating a timing to obtain the input data signal, the circuit comprising:

a first adjusting section that adjusts a phase difference between the input data signal and the input clock signal so as to be equal to a first phase difference, and outputs the resulting signals as a first data signal and a first clock signal;

a phase varying section that outputs a second clock signal having a designated phase difference with respect to the first clock signal; and a second adjusting section that adjusts the phase difference of the second clock signal with respect to the first clock signal so as to be equal to a second phase difference, based on a result of obtaining the first clock signal at a varying timing of the second clock signal.

8. The circuit as set forth in claim 7, further comprising:

a data obtaining section that obtains the first data signal at the varying timing of the second clock signal, to receive data.

9. The circuit as set forth in claim 7, wherein the first adjusting section adjusts at least one of phases of the input data signal and the input clock signal, and outputs the resulting signals as the first data signal and the first clock signal which have varying timings coinciding with each other, the phase varying section includes a variable delay circuit that delays the input clock signal by a designated time, and outputs the delayed input clock signal as the second clock signal, the second adjusting section adjusts a delay amount of the variable delay circuit based on the result of obtaining the first clock signal at the varying timing of the second clock signal, so as to adjust the phase difference of the second clock signal with respect to the first clock signal to be equal to a desired phase difference, and the circuit receives a signal from the device by obtaining the first data signal at the varying timing of the second clock signal.

10. A circuit for receiving a signal from a device, comprising:

a reference clock generator that generates a reference clock;

a first variable delay circuit that delays a data signal output from the device by a designated time, and outputs the delayed data signal;

a second variable delay circuit that delays, by a designated time, a clock signal which is output from the device and indicates a timing at which the data sisal is obtained, and outputs the delayed clock signal as a first delayed clock signal;

a first flip-flop that obtains the delayed data signal at a timing determined by the reference clock;

a second flip-flop that obtains the first delayed clock signal at a timing determined by the reference clock;

a first delay adjusting section that adjusts at least one of delay amounts of the first and second variable delay circuits so that the first and second flip-flops respectively obtain the delayed data signal and first delayed clock signal at a varying timing of a signal;

a third variable delay circuit that delays the clock signal by a designated time, and outputs the delayed clock signal as a second delayed clock signal; and a second delay adjusting section that adjusts a phase difference between the first and second delayed clock signals so as to be equal to a desired phase difference, by adjusting a delay amount of the third variable delay circuit based on a result of obtaining the first delayed clock signal whose phase is adjusted by the first delay adjusting section at a varying timing of the second delayed clock signal, wherein the circuit receives the signal from the device by obtaining the delayed data signal at the varying timing of the second delayed clock signal.

11. The circuit as set forth in claim 10, further comprising a first selecting section that selects one of a signal generated based on the reference clock and the second delayed clock signal, and supplies the selected signal to the first and second flip-flops, wherein the first delay adjusting section adjusts the delay amounts of the first and second variable delay circuits, while the first selecting section is configured so as to supply the signal generated based on the reference clock to the second flip-flop, the second delay adjusting section determines the delay amount of the third variable delay circuit, while the first selecting section is configured so as to supply the second delayed clock signal to the second flip-flop, and the first flip-flop obtains the delayed data signal at the varying timing of the second delayed clock signal, while the first selecting section is configured so as to supply the second delayed clock signal to the first and second flip-flops.

12. The circuit as set forth in claim 11, wherein the first delay adjusting section:

causes the first and second flip-flops to obtain the data signal and the clock signal at a plurality of times, while varying the delay amounts of the first and second variable delay circuits; and detects (i) such a delay amount of the first variable delay circuit that the numbers of times at which logical values L and H of the data signal are obtained become substantially same and (ii) such a delay amount of the second variable delay circuit that the numbers of times at which logical values L and H of the clock signal are obtained become substantially same, and assigns the detected delay amounts to the first and second variable delay circuits.

13. The circuit as set forth in claim 11, wherein
the second delay adjusting section adjusts the delay amount of the third variable delay circuit so that the varying timing of the second delayed clock signal is positioned so as to coincide with a substantially middle point within an H or L level period of the first delayed clock signal.

14. The circuit as set forth in claim 11, wherein
the third variable delay circuit includes therein (i) an adjusting variable delay circuit that adjusts a phase of the second delayed clock signal and (ii) a strobe variable delay circuit that varies a strobe position of the delayed data signal which is determined by the second delayed clock signal,
the second delay adjusting section adjusts the phase difference between the first and second delayed clock signals so as to be equal to the desired phase difference, by adjusting a delay amount of the adjusting variable delay circuit while a delay amount of the strobe variable delay circuit is set to a predetermined delay amount, and
the first flip-flop obtains the delayed data signal at the varying timing of the second delayed clock signal, based on a result of obtaining the delayed data signal at the varying timing of the second delayed clock signal while the delay amount of the strobe variable delay circuit is varied.

15. A test apparatus for testing a device under test, comprising:
a first adjusting section that adjusts a phase difference between a data signal and a clock signal so as to be equal to a first phase difference, and outputs the resulting signals as a first data signal and a first clock signal, the data signal being output from the device under test and the clock signal indicating a timing at which the data signal is obtained;
a phase varying section that outputs a second clock signal having a designated phase difference with respect to the first clock signal;
a second adjusting section that adjusts the phase difference of the second clock signal with respect to the first clock signal so as to be equal to a second phase difference, based on a result of obtaining the first clock signal at a varying firing of the second clock signal; and
a judging section that judges whether a signal output from the device under test passes or fails a test, based on a result of obtaining the first data signal at the varying timing of the second clock signal.

16. The test apparatus as set forth in claim 15, wherein
the test apparatus receives the data and clock signals from the device under test.

17. The test apparatus as set forth in claim 15, wherein
the test apparatus:
receives the data signal from the device under test; and
further comprises a clock restoring circuit that restores the clock signal from the received data signal, and
the first adjusting section adjusts the phase difference between the data signal that is received from the device under test and the clock signal that is restored by the clock restoring circuit so as to be equal to the first phase difference, and outputs the resulting signals as the first data signal and first clock signal.

18. The test apparatus as set forth in claim 15, wherein
the first adjusting section adjusts at least one of phases of the data signal and the clock signal, and outputs the resulting signals as the first data signal and the first clock signal which have varying timings coinciding with each other, the data signal being output from the device under test and the clock signal indicating a timing at which the data signal is obtained,
the phase varying section includes a variable delay circuit that delays the clock signal by a designated time, and outputs the delayed clock signal as the second clock signal,
the second adjusting section adjusts a delay amount of the variable delay circuit based on the result of obtaining the first clock signal at the varying timing of the second clock signal, so as to adjust the phase difference of the second clock signal with respect to the first clock signal to be equal to a desired phase difference.

* * * * *